United States Patent [19]

Schieber

[11] 4,091,084
[45] May 23, 1978

[54] PURIFICATION OF HGI$_2$ FOR NUCLEAR DETECTOR FABRICATION

[75] Inventor: Michael M. Schieber, Goleta, Calif.

[73] Assignee: The United States of America as represented by the United States Department of Energy, Washington, D.C.

[21] Appl. No.: 804,126

[22] Filed: Jun. 6, 1977

Related U.S. Application Data

[63] Continuation of Ser. No. 592,484, Jul. 1, 1975, abandoned.

[51] Int. Cl.$^2$ .............................................. C01G 13/04
[52] U.S. Cl. .............................. 423/491; 156/DIG. 82
[58] Field of Search ................ 423/491; 156/DIG. 82

[56] References Cited

U.S. PATENT DOCUMENTS

| 1,984,164 | 12/1934 | Stock | 423/491 X |
| 3,816,601 | 6/1974 | Junod | 423/491 |

OTHER PUBLICATIONS

IEEE Transactions on Nuclear Science, vol. NS-22, Feb. 1975, pp. 182-191.
"Prep. of Single Crystals" by Lawson and Nielsen, 1958, pp. 20, 57, and 58, Butterworths Sc. Pub., London.
"A Course in General Chem.", by McPherson and Henderson, 3rd Ed., 1927, p. 623, Ginn & Co., N. Y.
Appl. Phys. Ltrs., 23, 281, 1973, article by S. P. Swierkowski et al.
Journal of Crystal Growth, 24/25, 205-211, 1974.

Primary Examiner—Edward Stern
Attorney, Agent, or Firm—Dean E. Carlson; John A. Koch

[57] ABSTRACT

A process for purification of mercuric iodide (HgI$_2$) to be used as a source material for the growth of detector quality crystals. The high purity HgI$_2$ raw material is produced by a combination of three stages: synthesis of HgI$_2$ from Hg and I$_2$, repeated sublimation, and zone refining.

8 Claims, No Drawings

PURIFICATION OF HGI₂ FOR NUCLEAR DETECTOR FABRICATION

This is a continuation of application Ser. No. 592,484, filed July 1, 1975, now abandoned.

BACKGROUND OF THE INVENTION

The invention described herein was made in the course of, or under, Contract AT(29-1)-1183, with the United States Energy Research and Development Administration (formerly the United States Atomic Energy Commission).

This invention relates to the growth of mercuric iodide crystals, and more particularly to a process for purification of mercuric iodide to be utilized as a source material for the growth of such crystals.

Since the advent of semiconductor detectors, efforts have been directed to the development of detector materials having a sufficiently high atomic number so as to overcome the low photoelectric efficiency that results from low atomic number detector materials. Compounds such as CdTe and, more recently, $HgI_2$ have been explored. While mercuric iodide ($HgI_2$) promises to be one of the most potentially useful, high atomic number, room temperature operable radiation detector materials structural imperfections due primarily to high impurity concentrations have led to problems of carrier trapping and detrapping and of detector fabrication. While substantial effort has been directed to methods for growing $HgI_2$ crystals, relatively little effort has been directed to the development of high purity $HgI_2$ raw material to be used for growth of detector quality $HgI_2$ crystals. Technical literature directed to purification of the $HgI_2$ raw material is exemplified by an article by S. P. Swierkowski, et al. Appl, Phys, Ltrs. 23, 281, 1973, and an article by M. Schieber, et al, Journal of Crystal Growth 24/25. 205-211, 1974. As noted in the Journal of Crystal Growth article, in establishing the detector quality of a given crystal, experiments indicate that purity is a more critical requirement than physical perfection, and a higher degree of purification of both solvent and raw materials would lead to high quality detector crystals.

SUMMARY OF THE INVENTION

The present invention is directed to a process for the purification of $HgI_2$ utilized as raw material for growing crystals of detector quality. Broadly, the process involves a combination of three stages composed of synthesis of $HgI_2$ from Hg and $I_2$, repeated sublimation, and zone refining. The results of spectrochemical analysis of $HgI_2$ after each of these stages verifies that the overall process produces the optimum purification of the raw material.

Therefore, it is an object of this invention to provide a process for producing high purity $HgI_2$ raw material.

A further object of the invention is to provide a process for producing high purity material of $HgI_2$ which can be utilized as a source material for the growth of detector quality crystals.

Another object of the invention is to provide a process for producing high purity $HgI_2$ raw material by a combination of stages comprising synthesis of $HgI_2$ from Hg and $I_2$, repeated sublimation, and zone refining.

Other objects of the invention will become readily apparent from the following description.

DESCRIPTION OF THE INVENTION

The invention is directed to a process for producing high purity mercuric iodide ($HgI_2$) material to be utilized for growth of detector quality crystals. The purification process is basically composed of the following three sequential purification stages: (a) synthesis of $HgI_2$ from high purity mercury and repurified iodine, (b) repeated sublimation, and (c) zone refining.

While each of the three purification stages have been used individually, as set forth in the above-referenced Journal of Crystal Growth article, to provide source material for the growth of $HgI_2$ crystals, it has been found that the highest purity of $HgI_2$ raw material to be used for growth of detector quality crystals is produced by the combinational sequence of these three stages when used as set forth above. Tests, as described in greater detail hereinafter, have clearly illustrated that the herein disclosed sequence of purification stages provides a major improvement in the purity of the $HgI_2$ raw materials, thereby providing increased efficiency of radiation detectors using $HgI_2$ crystals made from the improved purity raw materials.

The first stage of the process, the synthesis of $HgI_2$, is done in the following way: mercury of 99.999 percent purity and iodine, purified by repeated sublimation until no red-colored residue is left behind, are melted together in stoichiometric amounts (200.59 gr mercury and 253.808gr iodine) in an evacuated (torr of $10^{-2}$ to $10^{-6}$) reaction tube or ampoule of Pyrex or quartz (tube volume of 400 to 500 ml) at a temperature of 260° C for 4 hours. The temperature can vary from 260° to 300° C and the time from ½ to six hours. A slight excess of iodine, amounting to about one percent by weight (0.1 to 1.5 wt.%) is added to compensate for vaporization loss, which may occur prior to sealing the tubes when evacuated with a vacuum pump. While the repeated sublimation iodine process is known, it is briefly described as follows: The iodine is introduced in an ampoule similar to the one used for repeated sublimation of $HgI_2$. Best results are obtained when iodine is introduced in the ampoule in an absence of air in a glove box. The ampoule is evacuated to $10^{-2}$ to $10^{-6}$ torr and introduced in the furnace. The temperature of the hot zone is about 50° to 100° C and the $\Delta T$ of 20° to 50° C. The number of sublimation cycles is determined by the fact that no red-colored residue is left in the ampoule.

The mercury and iodine mixture is best introduced in the reaction tube prior to sealing, and melting is carried out in a glove box under a continuous flow of dry argon (flow rate of 0.5 to 2 liters/min.). The term glove box utilized here is briefly described as a closed box of polyethylene which is operated from the outside with gloves. The box is sealed from the atmosphere and a vacuum or a continuous flow of an inert gas controls the desired atmosphere under working conditions. After melting of the mixture, the tube is cooled slowly (2 to 6 hours) to room temperature (22° C) and then placed in a gradient furnace, where the hot zone is about 100° C (60 to 110° C) in order to sublime the excess iodine. While gradient furnaces are known, one utilized herein is briefly described as a furnace having a uniform temperature zone in the center and a temperature gradient between the center and the end zones of the furnace where the cold zone has a temperature of about 25° to 40° C.

The synthetic material formed in accordance with the above-described stage is then subjected to the second stage of the process, repeated sublimation. Briefly, the repeated sublimation process is carried out as follows: The material is introduced in an ampoule of 200 to 500 ml, evacuated to a vacuum of $10^{-2}$ to $10^{-6}$, sealed; placed into a hot zone of 100° to 140° C and a cold zone of 60° to 80° C. A black residue is left behind in the hotter part of the ampoule.

While the purified material is in the colder part, the purified material is removed and reintroduced in a new ampoule and the whole procedure is repeated again and again. The number of cycles of repeated sublimation may vary between 6 and 30, this variation in cycles being determined by the amount of the residue which is still left behind.

The resublimed material is then introduced in a Pyrex or quartz tube of ½ inch diameter and 6 inches long, for example, evacuated and refilled with one-half atmosphere of argon, and subjected to the third stage of the process, zone refining. The argon may vary from 0.1 to 0.9 atmosphere, or nitrogen or helium may be used in place of argon.

The zone refining stage of the purification process constitutes a vertical zone refining process where two narrow (1 to 5) zones, separated 2 inches from each other, move downward at a rate of 0.2 inches/hour. Movement rates of 0.01 to 2 inches/hour are acceptable. The molten zone refining apparatus is briefly described as follows: Two holders allow a vertical ampoule to stay in place while one or several nickel-chromium coils of about ¾ to 1 inch diameter and 0.1 to 0.2 inch wide can move along the ampoule at variable rates of 0.01 to 2 inches/hour. Each coil is heated electrically and is followed by a concentric air cooler which narrows the width of the molten zone. In a test conducted, the coil temperature was not controlled, but was in the neighborhood of 700° C. The molten zone of $HgI_2$, however, was only about 259° C to, say, 300° C (259° C being the melting point of $HgI_2$). Thus, the ingot of the $HgI_2$ remains solid while the material where the hot coil passes is molten. The total number of zone passes varies from 30 to 100, the number being determined by the amount of black material which segregates usually at the bottom of the ampoule. In each case, a black-colored, impurity-rich, bottom part of the molten ingot is obtained. Vertical rather than horizontal zone refining is preferred for the following reason: $HgI_2$ has a high-vapor pressure and horizontal zone refining causes the appearance of both vapor and molten phases which prevent the dissolution of the impurities in the liquid phase and which is moved towards the ends of the ampoule.

In some cases, spectrochemical analysis could not detect certain impurities prior to the third stage, zone refining; but after increasing the content of the impurity by zone refining, the specific impurity could be detected. The efficiency of purification of each of the three stages of the mercuric iodide raw material purification process of this invention is summarized in the following semiquantitative spectrochemical analysis results. Table I gives the results of comparison of the content of impurities of the original iodine and mercury and the synthetic mercuric iodide ($HgI_2$) made in accordance with this invention. The units in Table I indicate parts per million (ppm).

Table I

| Element | Original Iodine | Iodine After Repeated Sublimation n = 30 | Red Color Residue After Sublimation of Iodine | 99.99999% Pure Mercury Metal | Synthetic $HgI_2$ |
|---|---|---|---|---|---|
| C  | 2  | trace | 10  | —  | —  |
| Ag | —  | —  | 3   | —  | —  |
| Si | —  | —  | 5   | 1  | 1  |
| Fe | 10 | 5  | 50  | —  | 1  |
| Mg | —  | —  | 5   | 1  | —  |
| Ca | —  | —  | 50  | —  | —  |
| Bi | —  | —  | —   | —  | —  |
| Al | 2  | —  | 10  | —  | —  |
| Na | 1  | —  | 10  | —  | —  |
| Ni | 5  | —  | 10  | —  | —  |
| Pb | —  | —  | —   | —  | —  |
| Ba | —  | —  | —   | —  | —  |
| B  | —  | trace | 50  | —  | 5  |
| Cr | 1  | 5  | 100 | —  | —  |
| Mn | 1  | —  | 30  | —  | —  |
| Sn | —  | —  | 20  | —  | —  |

Table II shows the efficiency of zone refining as a purification stage in the process. The multiple-zone refining or melting process produces a segregation of impurities in the bottom of the ingot, which is much above what could be detected in the bulk or original material and in the top of the ingot. The results given in Table II are in ppm after 92 zone refining passes of original Baker-produced $HgI_2$ raw material. Baker material being defined herein as that $HgI_2$ raw material known as "Baker's Spectrochemically Analyzed" material.

TABLE II

| Element | Original Baker Material | Zone Refined Bottom | Zone Refined Top |
|---|---|---|---|
| Cu | 4 | 1000 | 1 |
| Ag | 1 | 50 | 1 |
| Si | 2 | 100 | 8 |
| Fe | 3 | 50 | 3 |
| Mg | 3 | 50 | 2 |
| Ca | 1 | 100 | 1 |
| Bi | — | 100 | 1 |
| Al | — | 100 | 1 |
| Na | trace | 50 | 3 |
| Ni | — | 1 | — |
| Pb | — | 10 | — |
| Ba | — | 1 | — |
| B  | — | 100 | 3 |
| Cr | — | 2 | — |
| Mn | — | 5 | — |
| Sn | — | 7 | — |

The combination of the three stages of the prior known purification methods has proven to be superior over each one separately, as can be seen in Table III, wherein the impurities detected therein are identified, and where B = Baker Analyzed, RS = repeated sublimed, ZR = zone refined, N = the number of cycles or passes, and Sy = synthetic $HgI_2$ made in accordance with the three-stage operational sequence of this invention.

NOTE: Table III appears on page 10.

While a cursory review of the repeated sublimation (RS) column indicates that the material does not contain impurities in an amount that is detectable by the spectrochemical analysis, Table III shows that, after repeated sublimation, both Baker's (B) and synthetic (SY) $HgI_2$ material, if subjected to the additional purification stage of zone refining, the material is cleansed of impurities which can then be detected in the bottom or in the top part of the ingot. Impurities whose coefficient of segregation (K) is smaller than 1 are segregated in the bottom part of the ingot; while impurities where K is larger than 1 are segregated in the top of the ingot.

It has thus been shown the combination and operational sequence of the three-stage purification process of this invention; namely, synthesis, repeated sublimation, and zone refining, produce a high purity HgI$_2$ raw material that is particularly effective as the source material for the growth of detector quality crystals, by either the vapor-growth or solution-growth techniques. Thus, by use of the process of this invention for preparation of high-purity HgI$_2$ raw materials growth capabilities of high-purity nuclear, X-ray, and infrared solid state semiconductor spectrometer crystals has been substantially advanced.

While the three-stage purification process described herein has been applied only to HgI$_2$ raw material, it might be used for purification of other source material, such as germanium (Ge) (for intrinsic high-purity germanium detectors), cadmium-tellurium (CdTe), and other crystals for spectrometric detectors.

While particular examples, parameters, etc., have been described for carrying out the invention, modifications and changes will become apparent to those skilled in the art, and it is intended to cover in the appended claims all such modifications as come within the spirit and scope of this invention.

What I claim is:

1. A process for the purification of mercuric iodide raw material utilized in the growth of high-quality crystals comprising the sequential steps of: synthesis of mercuric iodide from essentially pure mercury and iodine purified by repeated sublimation by melting the mercury and iodine in stoichiometric amounts in an evacuated reaction tube at a temperature of 260° to 300° C for a time period of one-half to six hours, repeated sublimation of the synthetic mercuric iodine material by subjecting the synthetic mercuric iodide material in a gradient furnace having a temperature from about 60 to 80° C in the cool zone thereof to about 100° to 140° C in the hot zone thereof and subjecting the material to from 6 to 30 cycles through the gradient furnace, and zone refining of the thus resublimed material by subjecting the material to 30 to 100 melting passes through a furnace having a temperature of 259° to 300° C.

2. The process defined in claim 1, additionally including the step of adding about 1 wt percent iodine to the stoichiometric amounts of mercury and iodine to compensate for vaporization loss during sealing of the mercury and iodine mixture in the reaction tube.

3. The process defined in claim 1, wherein the step of melting the mercury and iodine is accomplished under a continuous flow of dry argon.

4. The process defined in claim 1, additionally including the step of cooling the tube slowly to room temperature.

5. The process defined in claim 1, wherein the step of zone refining of the thus resublimed material constitutes a vertical zone refining procedure.

6. The process defined in claim 5, wherein the vertical zone refining procedure is carried out by containing the resublimed material in an evacuated tube refilled with about ½ atmosphere of argon, and subjecting the thus contained material to from 30 to 100 melting passes causing impurities in the material to be segregated to the bottom and top portion of the material.

7. The process defined in claim 6, wherein the melting passes of the material are accomplished by positioning the tube in an apparatus where two narrow zones, separated about 2 inches from each other, move downward at a rate of about 0.2 inches/hour.

8. A process for the purification of mercuric iodide raw material utilized in the growth of high-quality crystals comprising the sequential steps of: synthesis of mercuric iodide from essentially pure mercury and iodine purified by repeated sublimation by introducing into a reaction tube a mixture of the mercury and iodine having a slight excess of iodine over stoichiometric amounts to compensate for vaporization loss, evacuating and sealing the tube and melting the mercury and iodine together at a temperature of 260° to 300° C for a time period of from about one-half to six hours; repeated sublimation of the synthetic mercuric iodine material by subjecting the material to six or more cycles in a furnace having a cold zone of 60° to 80° C and a hot zone of 100° to 140° C; and zone refining of the thus resublimed material by subjecting the material to 30 to 100 melting passes.

* * * * *

TABLE III

| Element | B | B, RS (N = 30) | B, RS(N = 30), ZR(N = 50) | | | SY (N = 30) | SY, RS (N = 30) | SY. RS(N = 30), ZR(N = 92) | | |
|---|---|---|---|---|---|---|---|---|---|---|
| | | | Bottom | Top | Center | | | Bottom | Top | Center |
| Cu | 4 | — | 1 | — | — | — | — | 5 | 5 | — |
| Ag | 1 | — | 1 | — | — | — | — | trace | trace | — |
| Si | 2 | 7 | 2 | 2 | 3 | 1 | 1 | 2 | 7 | 2 |
| Fe | 3 | 1 | 5 | — | — | 1 | — | 3 | 5 | — |
| Mg | 3 | 1 | — | — | — | — | — | 1 | 1 | 1 |
| Ca | 1 | — | — | — | — | — | — | 1 | trace | — |
| Bi | — | — | 1 | — | — | — | — | — | — | — |
| Al | — | — | — | — | — | — | — | trace | — | — |
| Na | trace | — | 1 | — | trace | — | — | 2 | 1 | — |
| Pb | — | — | 2 | — | — | — | — | 5 | — | — |
| B | — | — | — | trace | trace | 5 | trace | 5 | 4 | — |
| Sn | — | — | 2 | — | — | — | — | 5 | — | — |